(12) United States Patent
Fujimori et al.

(10) Patent No.: US 7,807,496 B2
(45) Date of Patent: Oct. 5, 2010

(54) FIELD EFFECT TRANSISTOR AND ITS MANUFACTURING METHOD

(75) Inventors: Masaaki Fujimori, Hatoyama (JP); Tomihiro Hashizume, Hatoyama (JP); Masahiko Ando, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 22 days.

(21) Appl. No.: 11/194,597

(22) Filed: Aug. 2, 2005

(65) Prior Publication Data

US 2006/0110847 A1   May 25, 2006

(30) Foreign Application Priority Data

Nov. 19, 2004   (JP) ............................. 2004-335779

(51) Int. Cl.
*H01L 51/40* (2006.01)
(52) U.S. Cl. .................. 438/99; 438/151; 257/E51.005
(58) Field of Classification Search .................. 438/82, 438/99, 151, 158, 149; 977/938; 257/40, 257/98, E51.005; 349/132, 135
See application file for complete search history.

(56) References Cited

U.S. PATENT DOCUMENTS 6,838,361 B2 * 1/2005 Takeo .......................... 438/493

2003/0059975 A1 * 3/2003 Sirringhaus et al. ........... 438/99
2004/0129978 A1 * 7/2004 Hirai ........................... 257/347
2004/0266054 A1 * 12/2004 Brazis et al. .................. 438/99
2005/0029591 A1 * 2/2005 Yudasaka et al. ............. 257/347
2007/0018151 A1 * 1/2007 Sirringhaus et al. ........... 257/40

FOREIGN PATENT DOCUMENTS

JP          2004-115805          9/2003

OTHER PUBLICATIONS

K. Sakamoto et al., "Determination of Molecular Orientation of Very Thin Rubbed and Unrubbed Polyimide Films", J. Appl. Phys., vol. 80., No. 1 (Jul. 1996), pp. 431-439.
X. Duan et al., "High-Performance Thin-Film Transistors Using Semiconductor Nanowires and Nanoribbons", Nature, vol. 425 (Sep. 18, 2003), pp. 274-278.

* cited by examiner

*Primary Examiner*—Khiem D Nguyen
(74) *Attorney, Agent, or Firm*—Hitachi America, Ltd.

(57) ABSTRACT

To provide a method of easily producing TFT in which the orientation of channel molecules or wires is enhanced, compared with conventional type organic TFT at a low price, a lyophilic TFT pattern encircled by a lyophobic area is formed on a substrate, spontaneous movement is made in a droplet containing organic molecules or nanowires dropped in a channel region by characterizing the form of the pattern, and the organic molecules or the nanowires are oriented in the channel region by the movement.

15 Claims, 9 Drawing Sheets

FIELD EFFECT TRANSISTOR AND ITS MANUFACTURING METHOD

CLAIM OF PRIORITY

The present application claims priority from Japanese application JP 2004-335779 filed on Nov. 19, 2004, the contents of which are hereby incorporated by reference into this application.

FIELD OF THE INVENTION

The present invention relates to a method of manufacturing a transistor, particularly relates to a method of manufacturing a transistor characterized in structure in which a channel of a transistor is formed by the aggregate of one-dimensional structures and the one-dimensional structures are highly oriented substantially in parallel with the channel between so-called two source and drain electrodes.

BACKGROUND OF THE INVENTION

In a thin, flat display device such as a liquid crystal display or an organic electroluminescent (EL) display, thin film transistors (TFT) using amorphous silicon or polycrystalline silicon for the material of a channel is used for a picture element driving device. In the meantime, as for a display device using an organic EL device, trials to use TFT using organic molecules for a driver circuit are widely made so as to reduce a manufacturing cost and realize a display device provided with flexibility.

In TFT using so-called low-molecular-weight organic molecules for a channel, in most cases, a vacuum-deposited film including pentacene is used. In the meantime, for a polymer, various molecules such as P3HT or F8T2 are used.

Generally, in case an organic molecules are used for a channel, a problem that the performance of FET is slow occurs. This reason is that the mobility of a carrier conducting in a channel is low, even single crystal pentacene the most mobility of which has been observed is two order of magnitude smaller than polysilicon, and the mobility is at most similar to amorphous silicon. In the case of polymers, the mobility is further two order of magnitude smaller than that of pentacene.

To improve such a problem, various techniques are proposed; however, in the case of low-molecular-weight organic molecules, it is general to use a single crystal for a channel and an evaporated film is often used. In the case of polymers, it is general to orient molecules in a direction parallel to a channel and various techniques for it are proposed. For example, in a patent document 1 (JP-A No. 115805/2004), to increase the orientation of molecules in a channel, molecules which have a photoalignment property are adopted as a polymer insulator used for a gate insulating film. Besides, as in a non-patent document 1 (Journal of Applied Physics, Vol. 80, 431, (1996)) for example, orientation by rubbing is also representative technique.

Recently, in addition to polymers, trials to use nanowires for a channel of TFT are made. For example, in the non-patent document 1, FET using silicon nanowires for a channel is produced. To make mobility of carriers higher, nanowires are oriented in a direction parallel to a channel as in the case of polymers. For example, in the case of a non-patent document 2 (Nature, Vol. 425, 275, (2003)), the orientation of wires randomly oriented on a surface of a solvent encircled by four plates is aligned in parallel with two plates by narrowing an interval between the opposite two plates as in a method of forming Langmuir-Blodgett films and the wire is bonded on a substrate.

As described above, techniques for increasing carrier mobility to enhance the performance of organic TFT have been developed. In most, the orientation of organic molecules forming a channel is enhanced to reduce the scattering of carriers in the channel. In TFT using semiconductor nanowire for a channel, technique for enhancing the orientation of nanowires for the similar purpose is also used.

However, the above-mentioned prior art has a problem from a viewpoint of the compatibility of the cost and the productivity requested from a practical viewpoint. For example, as vacuum evaporation used in manufacturing a thin film of low-molecular-weight organics requires a vacuum though the vacuum evaporation has an advantage that the thin film having high carrier mobility can be easily formed, it is disadvantageous in the cost and the productivity. Besides, the orientation of polymers and nanowires cannot be enhanced so much by reforming a surface on which a channel is formed or by rubbing, and carrier mobility cannot be enhanced to a required extent.

Propositions except these techniques also have a problem that the cost and the productivity cannot be also made compatible or enough orientation cannot be acquired.

For an advantage in using TFT using an organic molecule or nanowire for a channel for a display device, the display device has flexibility and in addition, it is low-priced. Therefore, there is a problem that even if TFT can be manufactured at a low price, the display device cannot be driven or that even if the display device can be driven, a TFT manufacturing cost is high.

SUMMARY OF THE INVENTION

The invention is made in view of such problems and the object is to provide a TFT manufacturing method of enabling producing such TFT that carriers conduct in a channel at high mobility by enhancing the orientation of channel molecules, with ease and high productivity at a low price.

To achieve the object, the invention utilizes the movement of a droplet containing molecules or nanowires forming a channel for manufacturing TFT. It is well-known technique that molecules or nanowires dissolved or dissipated in a droplet are arranged on a substrate in parallel with a direction in which the droplet is moved by dropping a droplet in which molecules or nanowires are dissolved or dissipated on the substrate and moving the droplet on the substrate; however, in the invention, molecules or nanowires are highly oriented in a channel by applying the phenomenon. Nanowires mean inorganic wires which include single walled or multiwalled carbon nanotubes, or silicon nanowires as a representative example, the diameter of which is a few to a few hundred nm and the length of which is approximately 100 nm to approximately tens of micrometers.

As in the invention, the following replacement holds true even if "a droplet in which molecules are dissolved or dissipated" is replaced with "a droplet in which nanowires are dissipated", the droplet in which molecules are dissolved or dissipated, and the droplet in which nanowires are dissipated are generically called "a droplet containing wire" in this specification. Similarly, molecules and nanowires are generically called wire merely.

According to the invention, wire contained in a droplet can be highly oriented on a substrate by inducing the spontaneous movement of the droplet containing the wire. The induction of the spontaneous movement of the droplet is enabled by forming a pattern on the substrate. The formation of the pattern can be realized at a low price. In the manufacturing of TFT with a method provided by the invention, it is possible to employ a printing method such as ink-jet printing, a channel consisted of highly oriented wire can be formed at a low price and with ease.

According to the invention, as wire forming a channel can be highly oriented, TFT with high carrier mobility can be manufactured. Besides, the invention is characterized in that a droplet is utilized for constructing a channel with highly oriented wires and low-priced TFT can be easily manufactured by an ink-jet process.

According to the invention, it is expected that a flexible drive circuit for a display device will be able to be formed by applying the above-mentioned printing technique using a flexible substrate.

Further, as in the invention, inorganic nanowires represented by silicon nanowire can be used, it is possible to realize TFT with carrier mobility of 10 to 100 times higher than TFT with channel of low-molecular-weight organic molecules or polymers. Thus, not only a device driving circuit but a peripheral circuit such as a shift register may be able to be made flexible.

BRIEF DESCRIPTION OF THE DRAWINGS

FIGS. 2A, 2B, 2C, and 2D are illustrations explaining a formation process of highly oriented wires ordered by the spontaneous movement of a droplet containing the wires in the invention.

FIGS. 5A, 5B, 5C, 5D, and 5E show an example for constructing TFT according to the invention using inorganic materials.

DETAILED DESCRIPTION OF THE PREFERRED EMBODIMENTS

Figure 1:
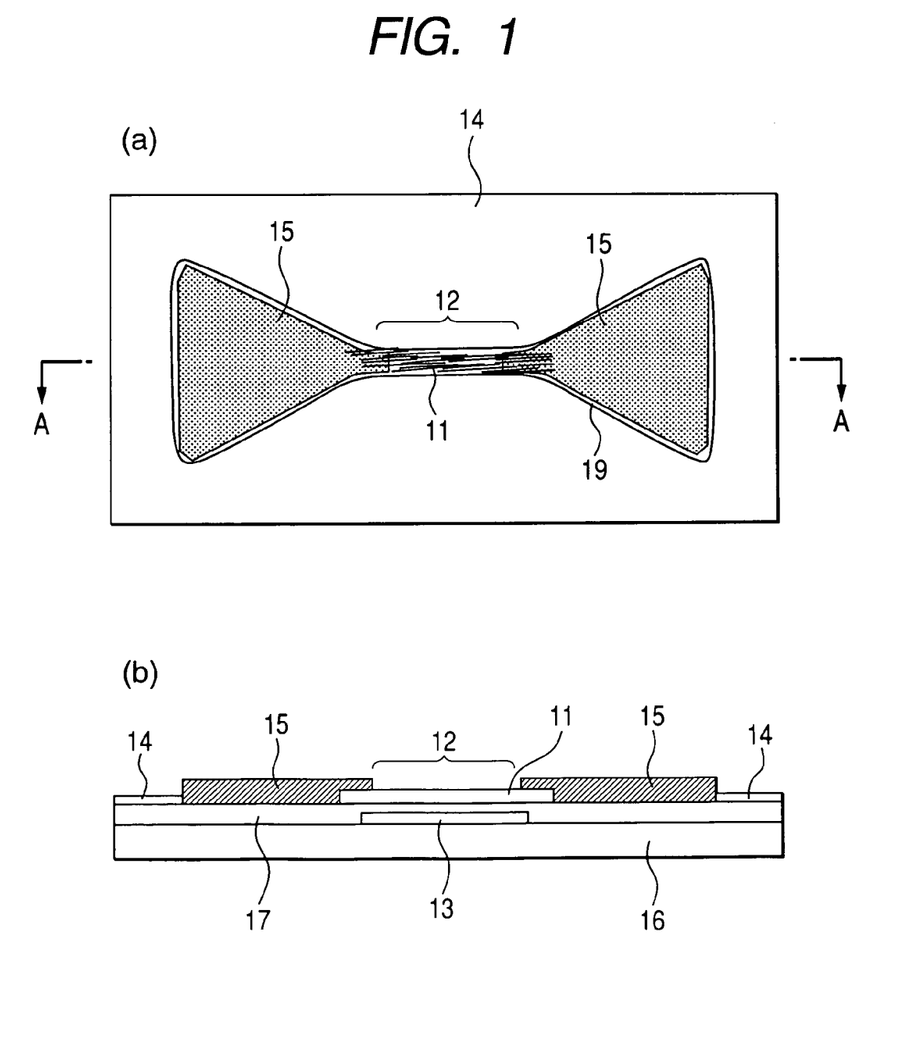
FIG. 1A is a plan showing the typical structure of TFT of the invention.
FIG. 1B is a cross section view of TFT structure along a line A-A.
Figure 2:
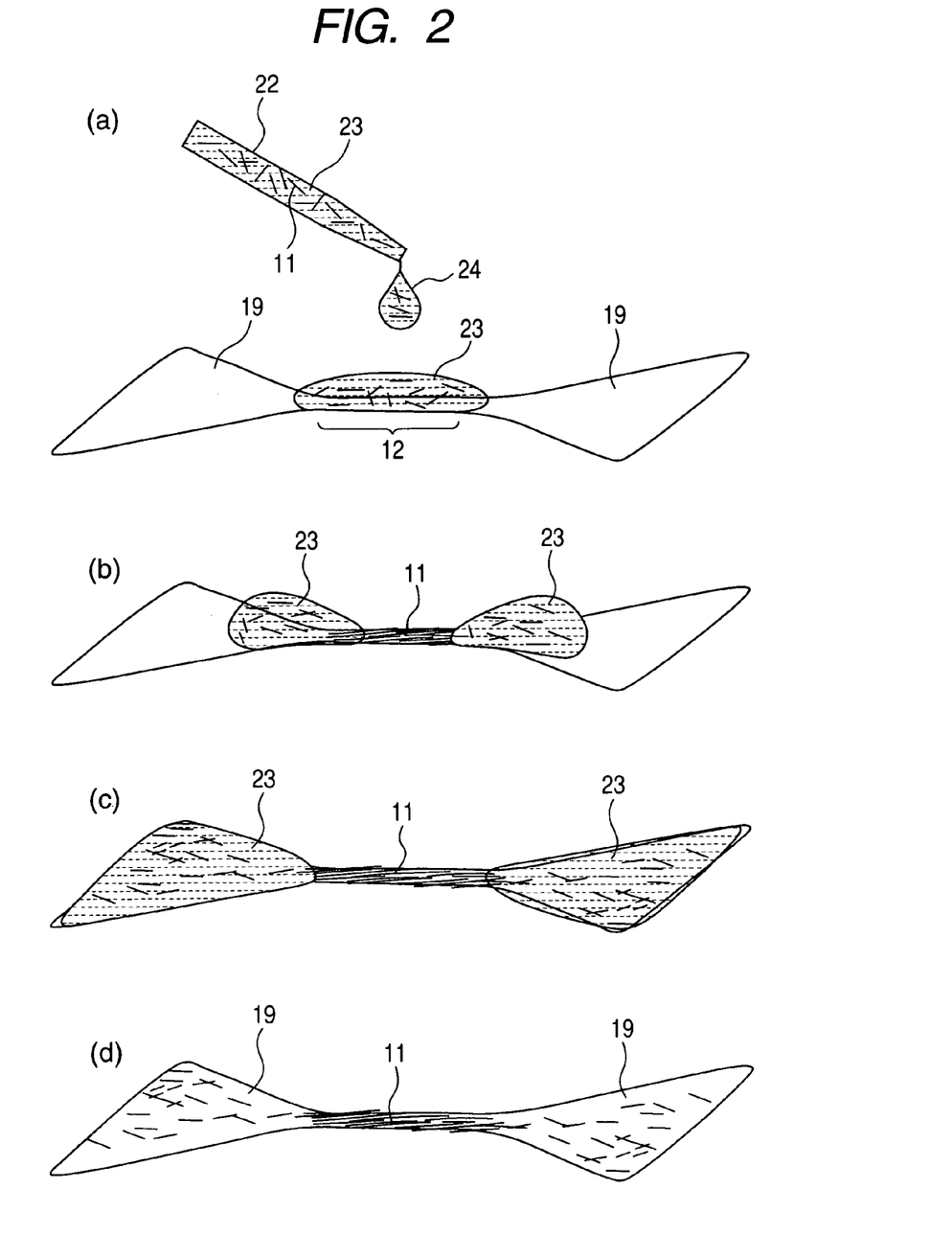
FIG. 2A shows a prepared surface on which a lyophilic area forming a TFT pattern is encircled by a lyophobic area.
FIG. 2B shows a state in which a dropped droplet containing wires leaks out into source and drain electrodes when the droplet exceeds a predetermined amount.
FIG. 2C shows a state in which the wires contained in the droplet is oriented in parallel with a direction of the movement of the droplet in a channel.
FIG. 2D shows a state in which the droplet is dried after it is moved as shown in FIG. 2C.

FIG. 1A is a plan showing the typical structure of TFT formed by the invention and FIG. 1B is a sectional view viewed along a line A-A from a direction shown by an arrow.

As shown in FIG. 1A, a reference number 15 denotes source and drain electrodes. A reference number 11 denotes nanowire and schematically shows a state in which oriented nanowires are grouped in an area to be a channel region 12 of TFT. A reference number 14 denotes a lyophobic area and 19 denotes a lyophilic area. In the invention, as described later, the group of nanowires 11 oriented to be the channel region 12 is formed utilizing the lyophilic area 19 encircled by the lyophobic area 14. Therefore, the lyophilic area 19 has the same shape as the pattern of TFT.

As shown in FIG. 1B, a reference number 16 denotes a substrate and after a gate electrode 13 is formed on its top face, an insulator 17 is formed. The lyophobic area 14 and the lyophilic area 19 respectively described in relation to FIG. 1A are formed on the insulator 17. The lyophilic area 19 is aligned with a position corresponding to the gate electrode 13. After the group of nanowires 11 oriented to be the channel region 12 is formed utilizing the lyophilic area 19, the source and drain electrodes 15 are formed. The above-mentioned procedure will be more concretely described later.

The invention is characterized in that the width of the channel region 12 connecting the source and drain electrodes 15 is smaller, compared with the width of the source electrode and the drain electrode.

FIGS. 2A to 2D are explanatory drawings for explaining that wire in a droplet is highly oriented by the spontaneous movement of the droplet containing the wire in the invention.

As shown in FIG. 2A, a surface acquired by encircling the lyophilic area 19 forming the TFT pattern by the lyophobic area 14 is prepared. In the lyophilic area 19, the channel region 12 and the source and drain electrodes on both sides of the channel region are formed. In a position corresponding to the channel region 12 of the lyophilic area 19, a droplet 23 containing wire 11 is dropped as a droplet 24 using a micropipet 22. As the lyophobic area exists around the droplet 23 dropped in the position corresponding to the channel region 12, the droplet remains in the channel region 12 of the lyophilic area 19 forming the TFT pattern. The lyophobic area 14 and the lyophilic area 19 may be formed by a well-known method. Further, it is desirable that difference in a level is provided so that the TFT pattern 19 is lower than its circumference and the circumference is worked to be the lyophobic area.

As shown in FIG. 2B, when the droplet 23 containing the wire 11 dropped in the channel region 12 exceeds a predetermined amount, the dropped droplet 23 cannot remain in the channel region 12 and leaks out into the source and drain electrodes. The droplet once leaked out of the channel region 12 continues to flow to the source and drain electrodes spontaneously even if no additional droplet is dropped. This reason is that a droplet has a property that its form is transformed so that its surface energy is of minimum. That is, a dropped droplet 23 can be spontaneously moved by narrowing channel width than the width of the source and drain electrodes so that the surface energy of a dropped droplet is smaller in the source and drain electrodes than that in the channel region 12.

Therefore, the area of the channel region 12 is required to be made small enough, compared with the area of the source and drain electrodes.

As shown in FIG. 2C, as the droplet 23 moves from the channel region 12 to the source and drain electrodes, the wire 11 contained in the droplet 23 remains in the channel region 12 in a state in which the wire is oriented in parallel with a direction of the movement of the droplet. That is, the highly-oriented group of wire 11 can be arranged in the channel region 12.

FIG. 2D shows a state in which the droplet 23 is dried after it is moved as shown in FIG. 2C. As shown in FIG. 2D, the wire 11 contained in the droplet moved to the source and drain electrodes is left after the droplet 23 is dried; however, no problem occurs even if the wire 11 is left because a metal thin film for forming each electrode is formed in the source and drain electrodes.

To enhance a degree of orientation, the droplet 23 containing the wire 11 and having faster movement velocity is advantageous. This speed greatly depends upon the viscosity of a used droplet and the concentration of wire dissolved or dissipated in the droplet. It is found that it is desirable that as to a droplet acquired by adding wire to the extent that its viscosity is not largely changed to chloroform which is one of organic solvents having relatively small viscosity or a droplet having viscosity similar to the viscosity of water most generally used for many solvents or dissipated liquid having slightly higher viscosity, the ratio of the area of the channel region 12 to the sum of the area of the source and drain electrodes is substantially 6 or more.

The form of the pattern of the source and drain electrodes is not required to be triangular as shown in FIG. 1A. A boundary of the channel region 12 and each of the source and drain electrodes has only to have such a pattern that the droplet 23 flowing out from the channel region 12 to each of the source and drain electrodes can be promptly spread in the source and drain electrodes. That is, if there is no remarkable ununiformity in comparison in length characterizing width and depth, the boundary may be in an arbitrary shape such as a rectangle and a square. It is further desirable that the ratio of the width of the channel to the length of the channel is one or more and below ten and if possible, the ratio is approximately 6 or less.

Figure 3:
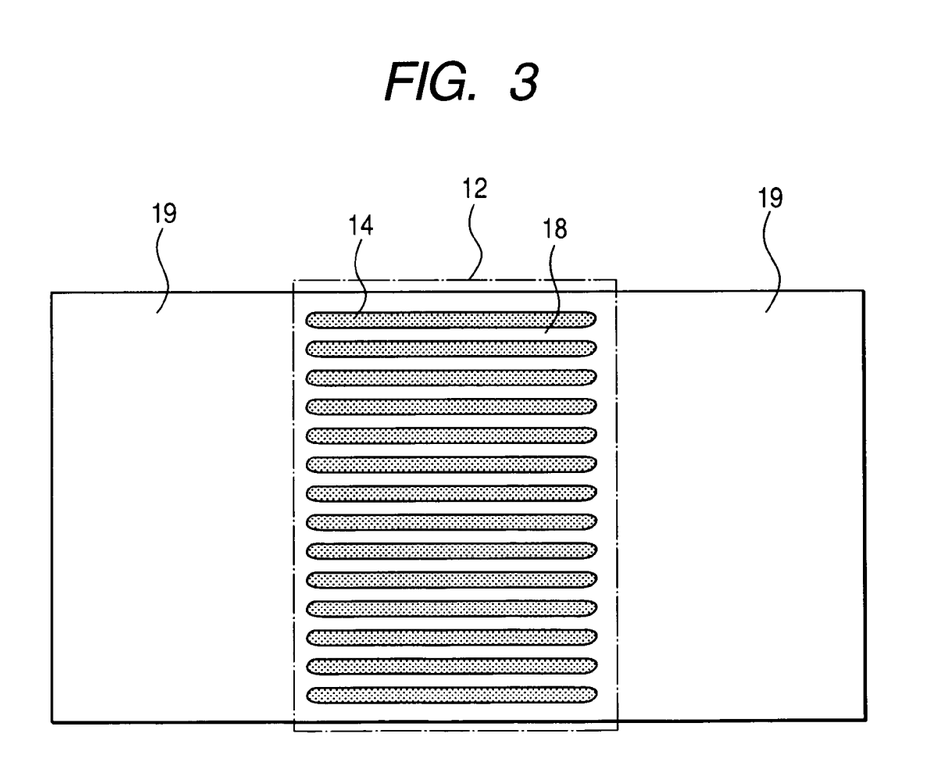
FIG. 3 is a plan view showing a channel region 12 which consists of parallel domains between the source and drain electrodes.

FIG. 3 is a plan showing an example in which the channel region 12 is configured by plural domains parallel to a pair of source and drain electrodes. In the example shown in FIG. 3, the TFT pattern 19 which is the lyophilic area encircled by the lyophobic area 14 is rectangular, the center functions as the channel region 12, and its both sides function as the source and drain electrodes. In this example, parallel plural lyophobic areas 14 are provided in the channel region 12. Therefore, as described in relation to FIG. 2, when the droplet 23 containing the wire 11 is dropped in the channel region 12 as the droplet 24, the droplet 23 dropped in the position corresponding to the channel region 12 remains in only the lyophilic area 19 in the channel region 12 except the lyophobic area 14 in the channel region 12. That is, a channel 18 divided into plural domains in parallel is formed in the channel region 12. In this case, each domain of the divided channel 18 has only to meet the above-mentioned condition. In this example, channel width can be effectively thickened. This has effect that current driving force is increased in single TFT.

According to the invention, structure that the wire contained in the droplet is oriented in a direction parallel to the channel region by the flow of the droplet generated by the movement of the droplet and the wire connects a source and a drain is formed. The dropping of a droplet is not limited to the above-mentioned method by the micropipet and such a method of using an ink-jet printer as disclosed in JP-A No. 229579/2003, JP-A No. 133691/2003 or JP-A No. 80694/2003 can be applied. For a method of forming an electrode and wiring, a method of manufacturing using a method of so-called direct printing described on pp. 67 to 78 of the June 17 issue (2002) of the Nikkei Electronics such as jetting ink, plating and offset printing is recently actively researched and an advantage that an electric circuit including electronic devices can be formed at a lower price by combining these techniques and the technique in the invention, compared with the conventional type method of using photolithography can be expected.

Figure 4A:
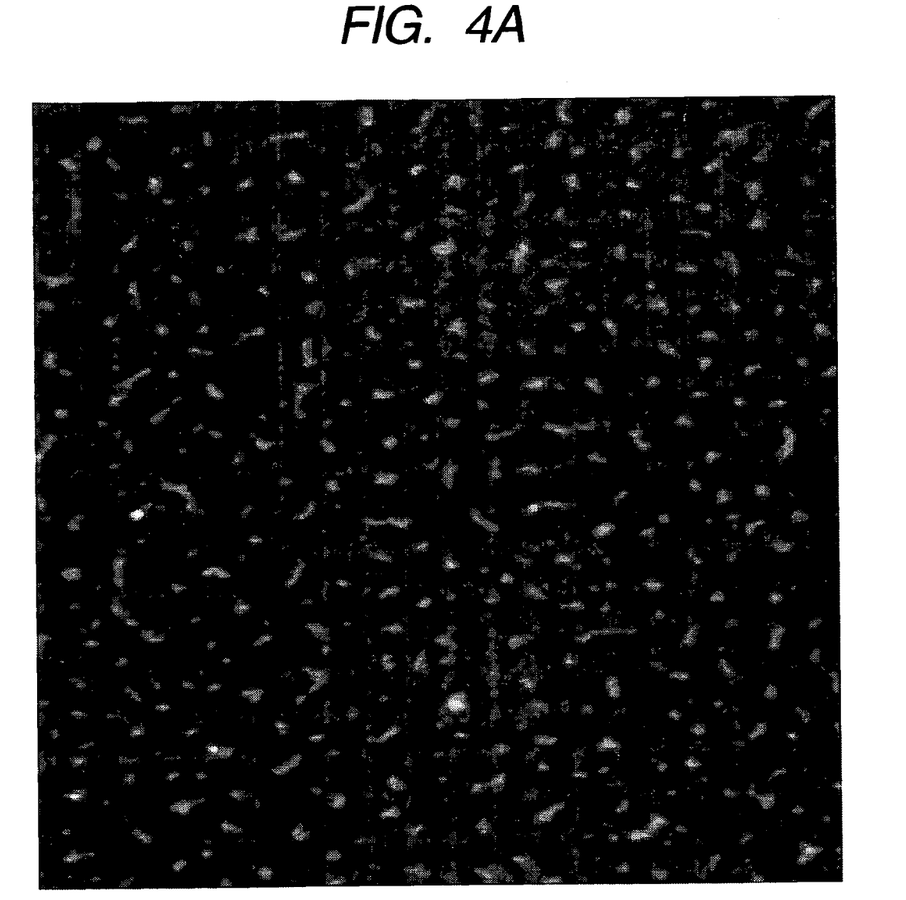
FIG. 4A is a topographic AFM image of polymers in the case that the movement velocity of a droplet put on the substrate is not enough to orient the polymers.
Figure 4B:
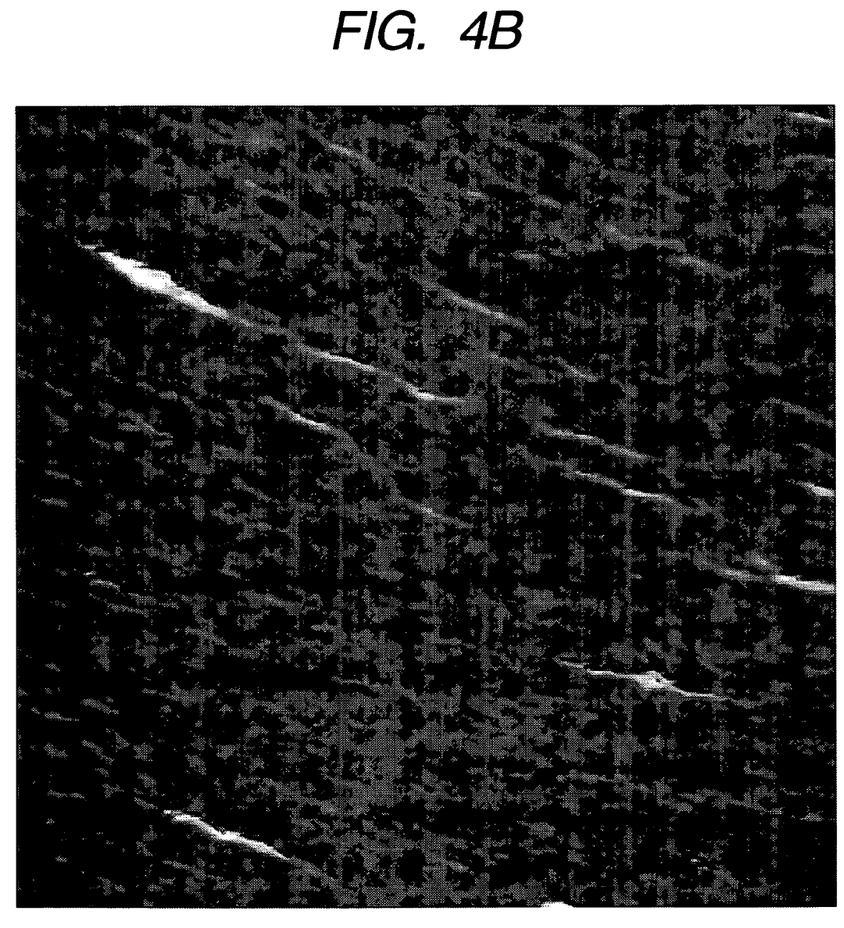
FIG. 4B is a topographic AFM image showing highly oriented polymers in the case that the velocity of a droplet is high enough.
Figure 4C:
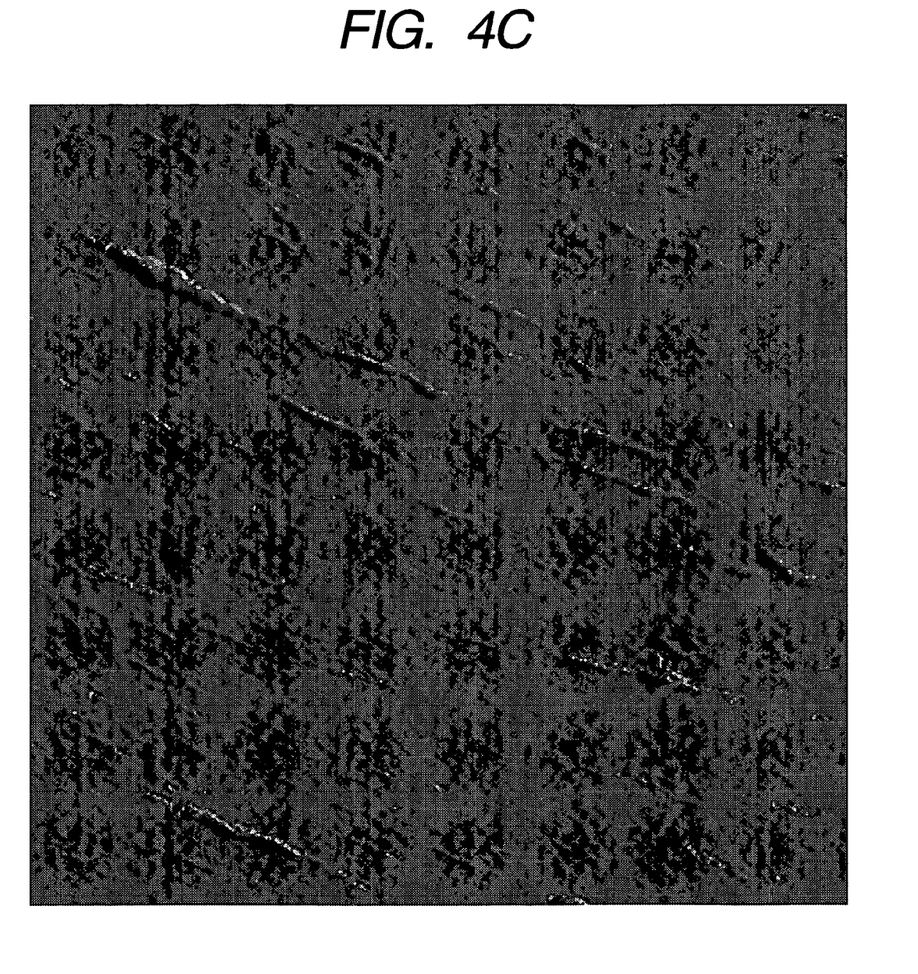
FIG. 4C shows an AFM amplitude image of the same area as FIG. 4B.

FIGS. 4A to 4C show AFM images that explain a situation of the orientation of the wires according to the invention. FIG. 4 show AFM images as a result of orienting PEDOT/PSS molecules using 1.3 wt % poly(styrenesulfonate)(PEDOT)/poly (2,3-dihydrothieno (3,4-b)-1,4-dioxin) (PSS) aqueous solution when the sum of the area of the source and drain electrodes/the area of the channel region is 6 and channel length/channel width is 6 in the experiment. A liquid current is made in a direction on the slightly right downside from the left. The observation areas of the AFM images are all 3×3 μm.

FIG. 4A shows a topographic AFM image of polymers in case the movement velocity of a droplet dropped on the substrate is not enough to orient the polymers. The rigidity of a polymer is generally low and when the movement velocity of a droplet is sufficient, a part of the polymer can be spread by force by the movement of the droplet with a position anchored to the substrate as a base point. However, when the movement velocity of a droplet is insufficient, a polymer cannot be spread, is aggregated on the substrate, and is anchored in a rounded state. In the meantime, in the case of rigid inorganic wire, for example, silicon nanowire and a carbon nanotube though it is not shown in FIG. 4A, as force which wire receives from a droplet is made minimum, wire is irregular in case the movement velocity of a droplet is insufficient and the wire is directed in a random direction or in a relatively random direction; however, as a whole, the wire is directed in a direction of the movement of a droplet.

FIG. 4B shows a topographic AFM image showing highly oriented polymers in case the movement velocity of a droplet dropped on the substrate is sufficient. In a part that looks light, a bundle of oriented polymers exists and it is seen that many polymers spread between the bundles are also oriented.

FIG. 4C shows an image of the same area as the image shown in FIG. 4B as an amplitude image by AFM. A state in which polymers are oriented can be seen in an emphasized state.

Referring to the drawings, some embodiments of a display device actuator according to the invention will be described below.

First Embodiment

FIGS. 5A to 5E show a concrete example in which TFT according to the invention is formed using inorganic materials. In FIGS. 5A to 5E, sectional views are shown on the left and plans are shown on the right.

As shown in FIG. 5A, to form a gate electrode 13 on a silicon substrate 16, an aluminum thin film having the thickness of 30 nm is formed on a thermal oxide film 17 by sputtering evaporation. The gate electrode 13 is formed by forming the aluminum film in a pattern shown in the plan by photolithography. That is, in a first embodiment, TFT including the aggregate of narrow plural channels in the channel region shown in FIG. 3 is formed. In the first embodiment, the length of the gate electrode is set to 1 mm, the width of the narrow channel is set to 50 μm, and channel width is set to 5 mm as a whole.

Next, as shown in FIG. 5B, a silicon oxide insulator 51 having the thickness of 20 nm is formed by spurring evaporation. Further, resist is coated by a spin coat and an inverted pattern of the gate electrode pattern is formed on the resist film 52 using a normal alignment method used in photolithography.

Next, as shown in FIG. 5C, to form a lyophobic film 53, a silane coupling agent with a fluorinated alkyl chain is applied. In the first embodiment, the silane coupling agent with the fluorinated alkyl chain (manufactured by Daikin Kogyo Co., Ltd., product name: Optool DSX) diluted up to 0.1 wt % by a solvent, 1,1,1,2,2,3,3,4,5,5,5-undecafluoro-4-(trifluoromethyl)pentane (manufactured by Daikin Kogyo, product name: DEMNUM solvent) is coated by a spin coat. In this state, the lyophobic film 53 is lifted off by dipping in acetone which is solution for dissolving resist and removing the resist, and a lyophobic pattern matched with the gate electrode 13 in the position and the shape and a lyophobic film 53 for preventing a droplet from leaking out of source and drain electrodes are formed.

Next, as shown in FIG. 5D, PEDOT/PSS aqueous solution having the concentration of 1.3 wt % is dropped in the channel region by approximately 3 microliters. using a micropipet. The dropped droplet is spontaneously moved from the channel region to the source and drain electrodes and oriented wire 11 is formed in the channel region.

Next, as shown in FIG. 5E, after the droplet remaining in the source and drain electrodes is dried, a metal thin film 15 is formed to form an electrode. In the first embodiment, the metal thin film 15 is formed by applying conducting ink to the source and drain electrodes and baking it. The conducting ink dropped in the source and drain electrodes does not flow into the channel region because of the gain of surface energy. Besides, the conducting ink does not leak out of the electrodes because of the already formed lyophobic film 53 shown in FIG. 5C.

The conducting ink has only to be a droplet containing at least one of metal nanoparticles, a metal complex and a conductive polymer, has only to have a property that the conducting ink is spread in each lyophilic area of the source and drain electrodes, and has only to have a resistance value low enough after baking. For concrete material, solution in which metal nanoparticles or a metal complex the diameter of which is approximately 10 nm and which mainly contain/contains gold, silver, palladium, platinum, copper or nickel are/is dissipated in a solvent such as water, toluene, xylene and an organic solvent can be used. In the first embodiment, water-based solution of silver nanoparticles is used. After the conducting ink is dropped by an amount enough to coat the source and drain electrodes, it is baked in a vacuum at 120° C. for 30 minutes and an electrode having the thickness of approximately 100 nm is formed. In case another conducting ink is used, it also has only to be baked at the optimum temperature of approximately 80 to 300° C. according to a type of the ink. As described above, the TFT is formed.

In the first embodiment, aluminum is used for the material of the gate electrode; however, the material may be also metal stably having satisfactory electrical conductivity in the air, for example, gold, silver, platinum, palladium, copper, nickel or iron. Besides, in the first embodiment, silicon with the oxide film and silicon oxide is used for the substrate and the insulator; however, the materials are not limited to these. However, for the substrate, materials having large insulation performance are desirable to prevent leakage current between each electrode. Besides, for the material of the lyophobic film, the silane coupling agent with the fluorinated alkyl chain is used; however, if only lyophobic monomolecules with a carbon chain terminated by a fluorine group are used in at least a part, another material may be also used, and for example, oxetane derivatives having a fluorine substituent as a side chain group and disclosed in JP-A No. 278874/2001 may be also used.

In the first embodiment, to accelerate the spontaneous movement of a droplet used for forming a channel, a pattern of the channel region and the source and drain electrodes of TFT is characterized; however, in addition, a droplet containing wire can be also moved by a method of dipping the substrate in the droplet containing the wire and pulling it out in a longitudinal direction of the channel, by blowing off a dropped droplet in the longitudinal direction of the channel by gas made to move at high speed by an air gun and others, by a method of applying a temperature gradient to the substrate and making different in temperature in the longitudinal direction of the channel to utilize that a droplet moves from a location of high temperature to a location of low temperature and by applying a gradient in lyophobic performance inside the pattern, and the orientation of the wire can be enhanced. As in these method, the pattern is not required to be characterized, these methods have an advantage that choices for an applicable form increase.

In the first embodiment, the conducting ink is used for forming the source and drain electrodes; however, in case organic molecules are used for the material of the channel, the baked temperature of the conducting ink is required to be approximately 300 degrees to prevent the decomposition of the molecules. A method of using lithography for forming the source and drain electrodes can be also applied. In this case, the channel region 12 is required to be covered with resist; however, when the resist is removed after the electrodes are formed, attention is required to be paid so that the wire forming the channel region 12 is not damaged.

In the first embodiment, the channel is formed prior to forming the source and drain electrodes; however, this way has an advantage that the contact of the wire forming the channel and the metal of the electrodes is kept satisfactory. However, the electrodes can be also formed prior to forming the channel. In this case, there is an advantage that normal lithography can be applied without considering an effect upon the channel. Besides, there is an advantage that in case the electrodes are formed by baking the conducting ink, the baking temperature can be also set to temperature equal to or higher than the decomposition temperature of organic molecules.

Figure 5:
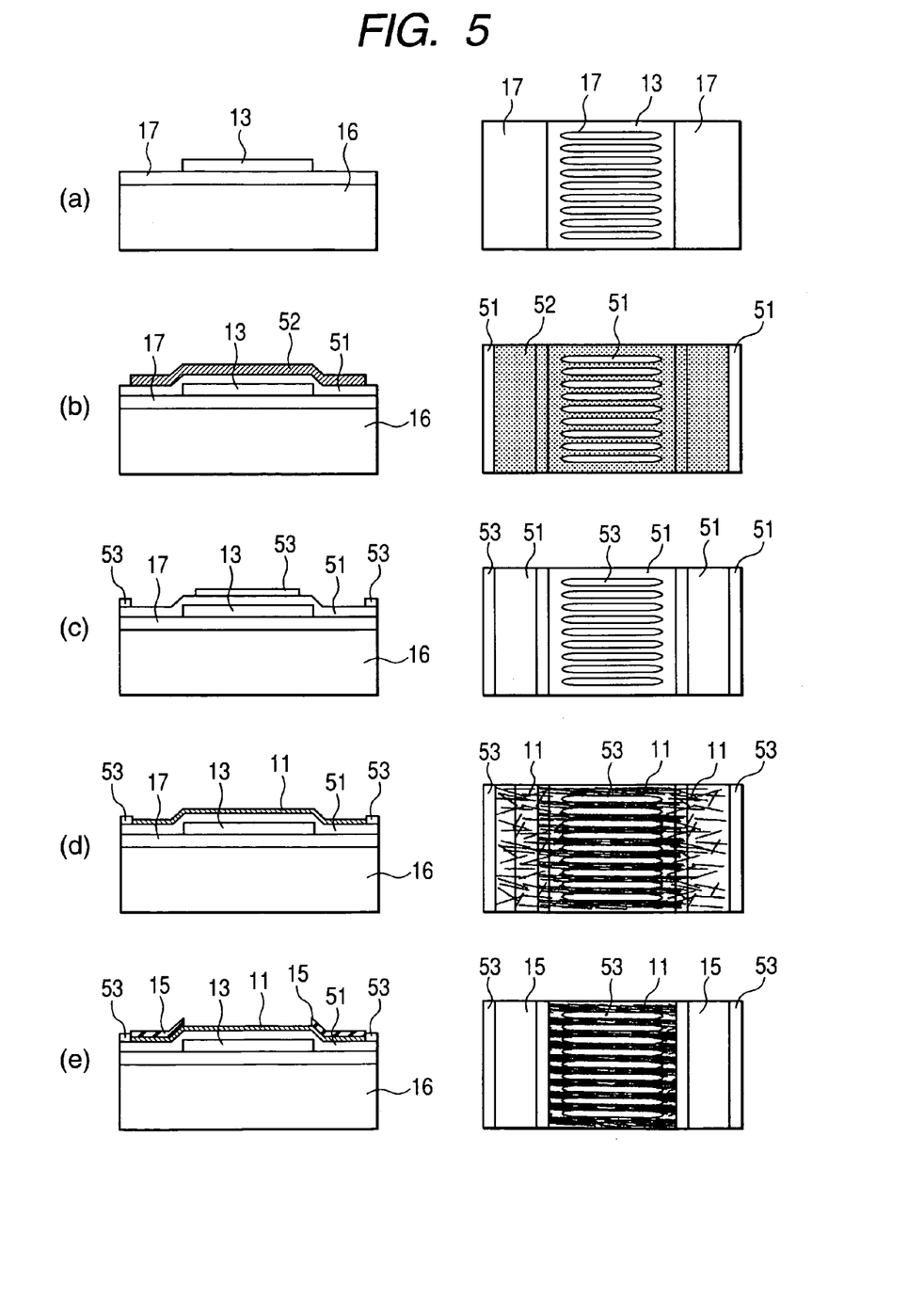
FIG. 5A shows that a photolithographically patterned gate electrode of an aluminum thin film is formed on a thermal oxide film.
FIG. 5B shows that a gate insulator film of silicon oxide and a resist film with the same pattern as the gate electrode is formed.
FIG. 5C shows that a lyophobic pattern is formed as reverse pattern of the gate electrode.
FIG. 5D shows that a droplet of solution or solvent including the wires is dropped in a channel region.
FIG. 5E shows that source and drain electrodes are formed.

In the first embodiment, the gate electrode 13 is worked in a pattern shown in FIG. 5; however, this is made to make the description in the first embodiment common to description in a second embodiment described later and to simplify the description, in case backsubstrate exposure technique described in the second embodiment is not used for patterning the lyophobic film as in the first embodiment, the gate electrode 13 is not required to have the pattern shown in FIG. 5, and for example, the gate electrode may also have a pattern that the whole part corresponding to the channel region is an electrode.

Second Embodiment

In a second embodiment, a method of producing TFT which uses flexible materials for a substrate and an insulator and which does not use lithography in a low-priced way such as printing and application will be described.

As in the method of forming the source and drain electrodes in the first embodiment, a gate electrode 13 having the pattern shown in FIG. 1A is printed on a plastic substrate using conducting ink. This is baked and the metal electrode 13 is formed; however, as plastic is used for the substrate, attention is required to be paid to softening temperature. In the second embodiment, a highly transparent polyimide sheet having the thickness of 100 µm is used for the substrate and as the baking temperature is set to approximately 300° C., it is verified that the substrate sufficiently endures the baking temperature of 120° C. in case water-based solution of silver nanoparticles is used. To form a gate insulator, polymethylmethacrylate (PMMA) is applied by a spin coat and is sufficiently dried. In the second embodiment, the film of PMMA is dried at 100 degrees for 10 minutes using a hot plate.

Next, a lyophobic pattern is formed. First, photosensitive liquid containing a catalyst for electroless deposition is spin-coated on a condition of 1500 rpm for 20 seconds. After prebaking is applied to the film at 50° C. for 15 minutes using the hot plate, ultraviolet rays are radiated from the back by a mercury lamp. As ultraviolet rays required for sensitizing are an i-line having the wavelength of 365 nm, it is desirable that ultraviolet rays having the wavelength of 300 nm or less are removed by a filter to prevent laminated polymer films from being damaged. As a metal thin film is already formed over the gate electrode, radiated ultraviolet rays cannot be transmitted in the gate electrode, the photosensitive liquid containing the catalyst for electroless deposition is exposed and hardened in only a part except the gate electrode. The photosensitive liquid containing the catalyst for electroless deposition in a region corresponding to the gate electrode is removed by baking at 135° C. for 15 minutes after radiation for one hour and cleaning in demineralized water. In this state, a copper thin film having the thickness of 10 nm or less is formed in a region except the part corresponding to the gate electrode by dipping in electroless copper plating solution for 10 seconds. The resistivity of the formed copper thin film is relatively large; however, as the metal film is formed for forming a lyophobic film described below, there is no problem. As in the first embodiment, a silane coupling agent with a fluorinated alkyl chain is spin-coated. As the silane coupling agent is bonded to only inorganics, only the region in which the copper thin film is formed expresses a lyophobic property. A channel and source and drain electrodes are formed by wire as in the first embodiment. Flexible TFT can be formed in a low-priced way such as printing and application without using lithography.

In the second embodiment, polyimide is used for the substrate and PMMA is used for the insulator; however, various flexible plastic including polyvinylphenol may be also used for the substrate, and polyimide and polyvinylphenol may be also used for the insulator. In case flexibility is not particularly required, an advantage that choices of a process such as printing and application increase can be acquired by using an inorganic insulator for the substrate. After the gate electrode is formed, an insulator is formed by spin on glass (SOG), positive resist is spin-coated and ultraviolet rays are radiated from the back using the mercury lamp. As resist except the region screened by the gate electrode is dissolved and removed by development, a resist pattern is the same as the gate electrode. In this state, a silane coupling agent with a fluorinated alkyl chain is spin-coated, is lifted off by removing the resist using acetone, and a desired lyophobic pattern is acquired. As in this method, heat treatment at approximately 500° C. is required for baking by SOG and an organic solvent is used for removing resist, this method cannot be used in case organic materials are used for the substrate and others. This method has advantages that the number of procedures of the manufacturing process can be reduced, no metal is required for forming the lyophobic film and as silicon oxide is used for the insulator, carrier mobility is slightly increased.

Third Embodiment

In a third embodiment, an example in which a pixel of an active matrix display device using TFT according to the invention for a driver circuit is manufactured will be described.

Figure 6A:
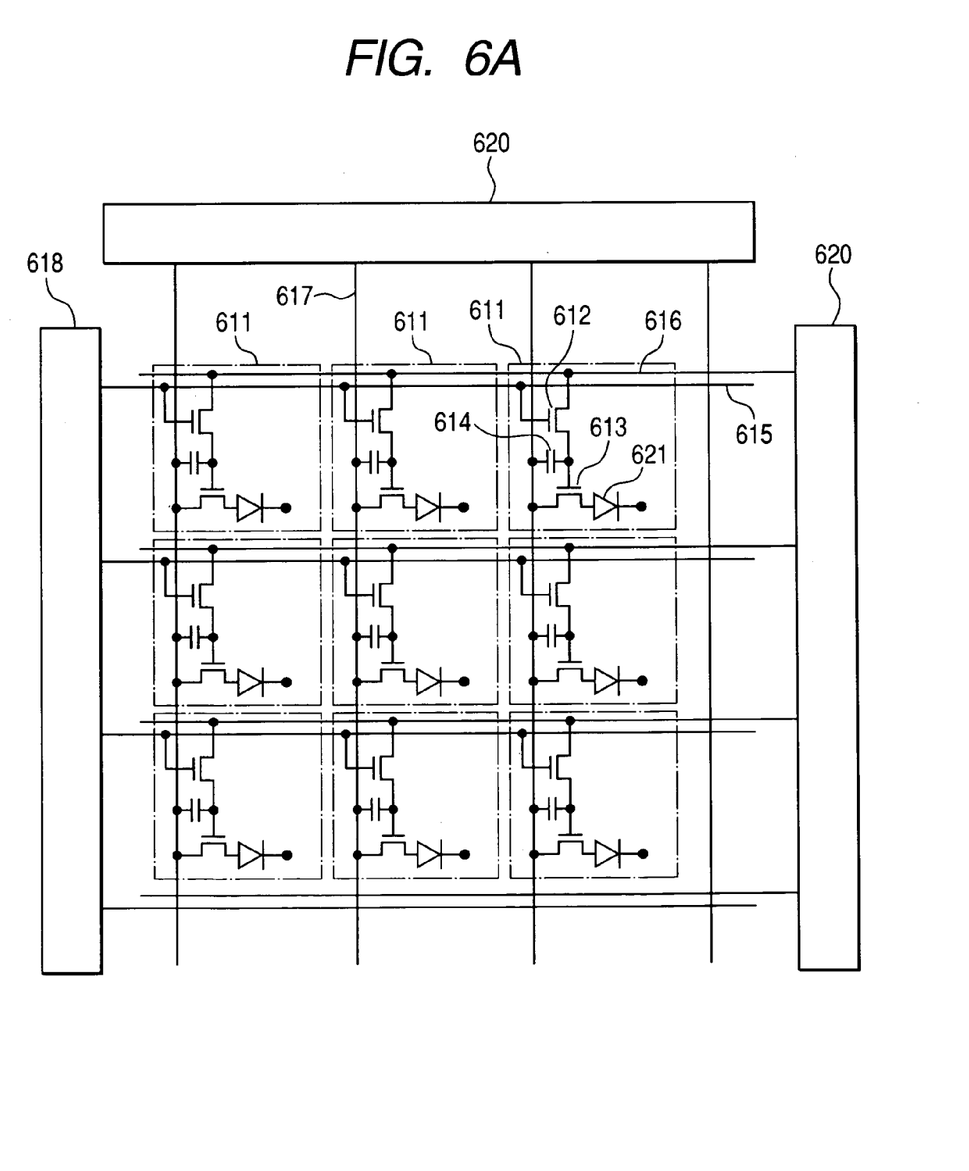
FIG. 6A shows an equivalent circuit for 3×3 pixels of an active matrix display device which uses TFTs of this invention in a driver circuit.

FIG. 6A shows an equivalent circuit for 3×3 pixels of the active matrix display device which uses TFTs of this invention in the driver circuit. A circuit for driving a pixel of a liquid crystal display cannot be used for a driver circuit for an organic electroluminescence device as it is as described on pp. 163 to 167 of the April 24 issue in 2000 of the Nikkei Electronics and one extra TFT is required for current control, compared with a liquid crystal. In this embodiment, a method of manufacturing a driver circuit which uses two TFTs per pixel will be described as described on pp. 163 to 167 of the April 24 issue in 2000 of the Nikkei Electronics and in JP-A No. 316295/2003.

A reference number 618 denotes a driver circuit for scan lines and the driver circuit sends a signal to the scan lines 615 at a predetermined cycle. A reference number 619 denotes a driver circuit for data lines and the driver circuit sends an image data signal to the data lines 616. A reference number 620 denotes a current supply circuit and the current supply circuit supplies current to current supply lines 617 at the same cycle as the scan lines 615. A reference number 611 denotes a pixel selectively driven by these circuits. Each pixel is configured by a picture element 621 and its control circuit. The picture element control circuit is configured by picture element selection TFT 612, current control TFT 613, a capacitor 614 and related wiring. In the case of a display having more pixels, as the display is an active matrix type, pixels have only to be increased.

Figure 6B:
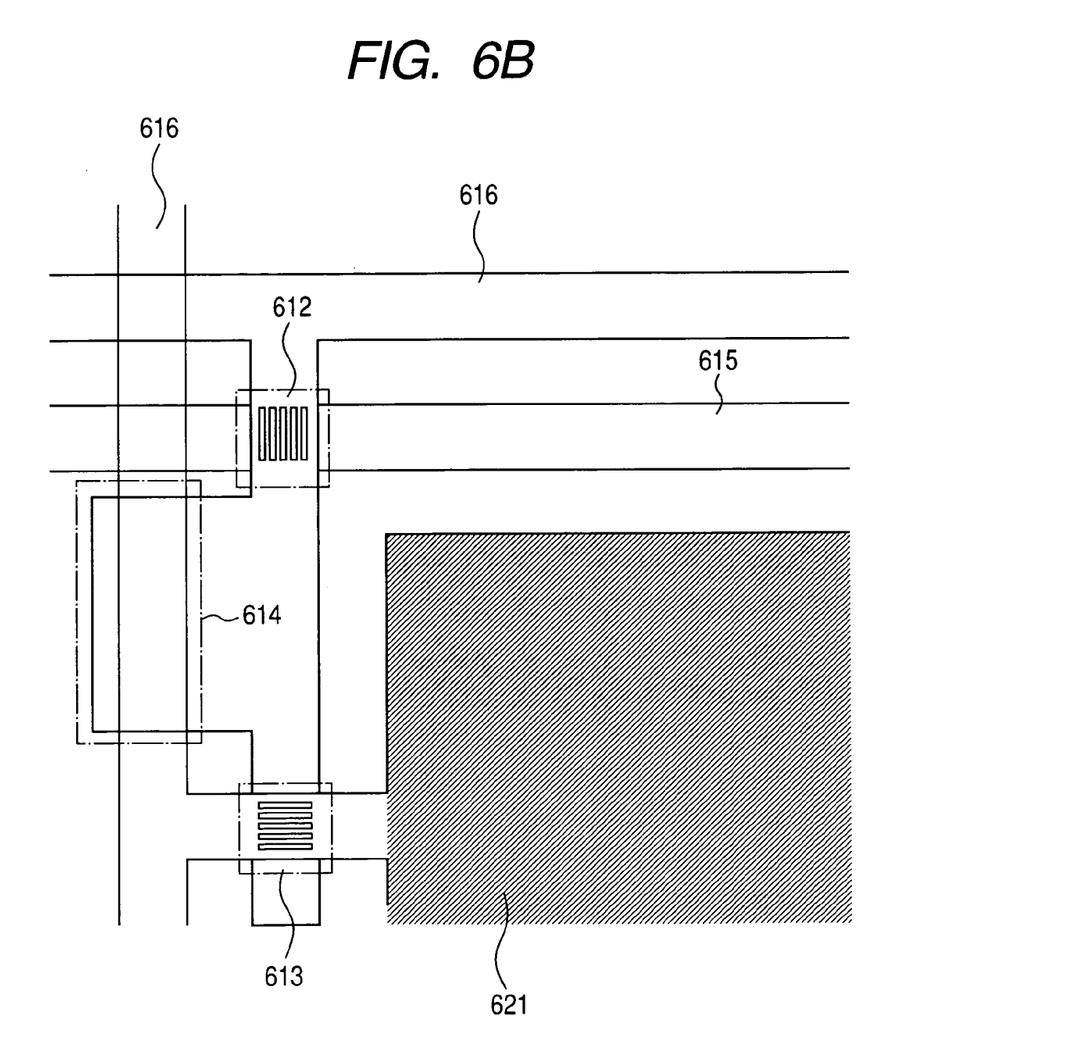
FIG. 6B shows an example of the construction of the pixels shown in FIG. 6A.

FIG. 6B shows a concrete configuration example of pixels shown in FIG. 6A. A manufacturing method is the same as the method of using the substrate made of an inorganic insulator described in the second embodiment. The outline will be described below.

First, metal wiring having a pattern of the scan lines 615 is printed on a glass substrate. The width of the wiring is set to 60 µm. As the scan line 615 also functions as a gate electrode of the picture element selection TFT 612, a gate electrode pattern for forming a channel pattern of the picture element selection TFT 612 is arranged in a predetermined position as described in the first and second embodiments. In the third embodiment, channels of the picture element selection TFT 612 and the current control TFT 613 are also formed as an aggregate of plural narrow channels shown in FIG. 3 as in the first embodiment. The width of the narrow channel is set to 10 µm and the channel length and the window width are both set to 60 µm. After an insulator is formed by SOG, a wiring pattern of the data lines 616 is produced prior to forming the channel of the picture element selection TFT 612.

In the third embodiment, after resist is applied, the top face of the data line pattern is exposed using the mask and the data line pattern is transferred. Note that a region corresponding to the channel of the picture element selection TFT 612 should be excluded from the data line pattern. The data line 616 also functions as a gate electrode of the current control TFT 613 and as in forming the picture element selection TFT 612, a channel pattern of the current control TFT 613 is formed in a part of the data line pattern. After development, the data line 616 is formed using conducting ink. As the baking temperature of the conducting ink using silver nanoparticles used in the third embodiment is 120° C., the resist remaining after baking can be removed.

After the resist is removed using acetone, positive resist is spin-coated again to form the channel of the picture element selection TFT 612 and is exposed from the back. This is developed and a silane coupling agent with a fluorinated alkyl chain is spin-coated. The remaining resist is removed by acetone and a lyophobic film is formed in a region except the scan lines and the data lines 616. A method of forming the channel of the picture element selection TFT 612 is similar to the method described in the first embodiment. An amount of a droplet containing wire of an amount suitable for only a channel region is extremely little and it is difficult to control the amount of the droplet; however, actually, even if a droplet containing wire of approximately microliter. is dropped, the droplet flows into a data line region through source and drain electrode regions and there is no problem.

In the third embodiment, as SOG is used for forming an insulator, silicon nanowire is used for wire which can endure its baking temperature; however, if an organic insulator such as polyimide is used for the insulator, it can be applied and heat treatment temperature can be also lowered. In that case, organic molecules can be also used for wire and there is an advantage that the cost can be reduced.

Afterward, an insulator is formed by SOG, and the current supply line 617, the picture element counter electrode 621 and the current control TFT 613 are formed by the similar method. After photosensitive polyimide is applied to the uppermost layer and the top face is exposed in a state in which the picture element counter electrode region is masked, a through hole can be formed in a protection film and the picture element counter electrode region by developing and baking. Afterward, an EL film is formed in a picture element region by a method disclosed in JP-A No. 47494/2004 for example, an ITO film is formed using photosensitive ITO to be an upper electrode, and the picture element and its driver circuit can be formed. When the scan line driver circuit 618, the data line driver circuit 619 and the current supply circuit 620 are further formed, the active matrix display device can be configured.

In the third embodiment, the processes by printing and application such as SOG is used for forming the insulator and the conducting ink is used for forming the data line 616 and the current supply line 617 are adopted; however, it need scarcely be said that film growth technique in a vacuum used in a normal semiconductor device manufacturing process can be used instead. There is an advantage that each wiring pattern can be precisely aligned by using the normal semiconductor device manufacturing process.

In the meantime, each wiring pattern can be also formed using ink-jet printing technique. In this case, printing and application can be used in the whole manufacturing process and the manufacturing cost can be greatly reduced. Besides, manufacturing steps are also greatly reduced. In case printing and application are used, an error in the alignment of each wiring pattern is increased, compared with that by lithography; however, as a requirement for an error in alignment for the picture element control circuit is greatly relieved, compared with an error in alignment required for a logic circuit, there is no problem except a TFT region if the error is approximately 30 μm of an error in alignment by jetting ink. As for the TFT region, in the third embodiment, as a pattern carved by lower wiring is used for forming a channel, a TFT region of upper wiring is required to be located in a channel pattern position of the lower wiring and as to registration, in the case of the channel width of approximately 60 μm in the third embodiment, only misregistration of at most a few μm is allowed. However, this can be avoided by preparing the channel pattern carved by the lower wiring by wider width than required width. As the carved pattern does not have a large effect upon a function of wiring, the proper wiring function has no problem even if the wider channel pattern is prepared.

What is claimed is:

1. A method of producing a field effect transistor, comprising:
    forming a gate electrode on a substrate;
    forming a silicon oxide insulator on the gate electrode and the substrate;
    forming a lyophobic film which encircles a channel region, a source region and a drain region when viewed in plane view, located on the silicon oxide insulator so that a width between the lyophobic film in the channel region is narrower than a width between the lyophobic film in the source region and the drain region;
    dropping a droplet containing a channel material between the lyophobic film in the channel region;
    drying the droplet after the droplet leaks out from the channel region to the source region and the drain region; and
    forming a source electrode and a drain electrode in the source region and the drain region respectively.

2. The method according to claim 1, wherein:
    a sum of the area of the source region, and the drain region is larger than an area of the channel region.

3. The method according to claim 1, wherein:
    boundaries of the channel region, the source and the drain region form a pattern such that the droplet leaked out from the channel region to the source and drain regions can be promptly spread in the source and drain regions.

4. The method according to claim 1, wherein the source and drain regions are formed in a shape of a triangle, a square or a rectangle having a width greater than a width of the channel region.

5. The method according to claim 1, wherein the silicon oxide insulator is a lyophilic area.

6. The method according to claim 1, wherein the channel material is wires.

7. The method according to claim 1, wherein the channel material is organic molecules.

8. A method of producing a field effect transistor, comprising:
    forming a gate electrode on a substrate;
    forming a silicon oxide insulator on the gate electrode and the substrate;
    forming a first lyophobic film which encircles a rectangular TFT pattern when viewed in plane view, located on the silicon oxide insulator and a plurality of second lyophobic films which are directed parallel to a direction from a source region of the TFT pattern to a drain region of the TFT pattern so that a width between the second lyophobic films in a channel region of the TFT pattern is narrower than a width between the first lyophobic film in the source region and the drain region;
    dropping a droplet containing a channel material between the second lyophobic film in the channel region;
    drying the droplet after the droplet leaks out from channel region to the source region and the drain region; and
    forming a source electrode and a drain electrode in the source region and the drain region respectively.

9. The method according to claim 8, wherein the source and drain regions are formed in a shape of a triangle, a square or a rectangle having a width greater than a width of the channel region.

10. The method according to claim 8, wherein the silicon oxide insulator is a lyophilic area.

11. The method according to claim 8, wherein the channel material is wires.

12. The method according to claim 8, wherein the channel material is organic molecules.

13. A method of producing a field effect transistor, comprising:

forming a gate electrode on a substrate;

forming a silicon oxide insulator on the gate electrode and the substrate;

forming a lyophobic film which encircles a channel region, a source region and a drain region when viewed in plane view, located on the silicon oxide insulator so that a width between the lyophobic film in the channel region is narrower than a width between the lyophobic film in the source region and the drain region;

dropping a droplet containing a channel material between the lyophobic film in the channel region;

letting the droplet remaining between the lyophobic film in the channel region leak out from the channel region to the source region and the drain region;

forming a channel comprising the channel material by drying the droplet after the droplet leaks out; and forming a source electrode and a drain electrode in the source region and the drain region respectively.

14. The method according to claim 13, wherein the channel material is wires.

15. The method according to claim 13, wherein the channel material is organic molecules.

* * * * *